US010527657B2

(12) United States Patent
Ragaini et al.

(10) Patent No.: US 10,527,657 B2
(45) Date of Patent: Jan. 7, 2020

(54) ELECTRICAL QUALITY MEASURING APPARATUS AND ELECTRICAL QUALITY MEASURING METHOD

(71) Applicant: ABB S.p.A, Milan (IT)

(72) Inventors: Enrico Ragaini, Bergamo (IT); Emilio Locatelli, San Pellegrino Terme (IT)

(73) Assignee: ABB S.P.A., Milan (IT)

( * ) Notice: Subject to any disclaimer, the term of this patent is extended or adjusted under 35 U.S.C. 154(b) by 0 days.

(21) Appl. No.: 15/966,063

(22) Filed: Apr. 30, 2018

(65) Prior Publication Data
US 2018/0246149 A1    Aug. 30, 2018

Related U.S. Application Data

(62) Division of application No. 15/000,091, filed on Jan. 19, 2016, now abandoned.

(30) Foreign Application Priority Data

Feb. 3, 2015 (EP) .................................... 15153694

(51) Int. Cl.
*G01R 19/25* (2006.01)
*G01R 21/133* (2006.01)
(Continued)

(52) U.S. Cl.
CPC ....... *G01R 19/2506* (2013.01); *G01R 21/133* (2013.01); *G01R 25/00* (2013.01); *H02J 3/00* (2013.01)

(58) Field of Classification Search
CPC .. G01R 19/2506; G01R 25/00; G01R 21/133; H02J 3/00
See application file for complete search history.

(56) References Cited

U.S. PATENT DOCUMENTS

| 4,709,339 A | 11/1987 | Fernandes |
| 2003/0036867 A1 | 2/2003 | Carlson |

FOREIGN PATENT DOCUMENTS

| EP | 0853364 A2 | 7/1998 |
| WO | 0241538 A1 | 5/2002 |
| WO | 2009120640 A2 | 10/2009 |

OTHER PUBLICATIONS

Briggs, E. (2011). Sample Clock Offset Detection and Correction in the LTE Downlink Receiver. Retrieved from https://www.wirelessinnovation.org/assets/Proceedings/2011Europe (Year: 2011).*

(Continued)

*Primary Examiner* — Jarrett J Stark
(74) *Attorney, Agent, or Firm* — Manelli Selter PLLC; Edward Stemberger

(57) ABSTRACT

An electrical quantity measuring system includes an electrical circuit of an electrical distribution network and an electrical quantity measuring apparatus. The apparatus includes a synchronization module structured to generate a synchronization signal; and a first measurement apparatus connectable to an electrical circuit and structured to receive the synchronization signal and provide a first Fourier transform coefficients representing a first electrical quantity associated with the electrical circuit and a first delay value depending on a time offset between a measurement instant associated with the measure of the first electrical quantity and a reception instant of the synchronization signal at the first measurement apparatus. The measuring apparatus also comprises a processing module structured to process the first Fourier transform coefficients and the first delay value and provide first time-shifted Fourier transform coefficients representing a first synchronized measured electrical quantity.

13 Claims, 5 Drawing Sheets

(51) Int. Cl.
  *G01R 25/00*   (2006.01)
  *H02J 3/00*   (2006.01)

(56)      References Cited

OTHER PUBLICATIONS

Mikael Nordam (2004).An Architecture for Wireless Sensors in Distributed Management of Electrical Distribution Systems (Year: 2004).*

Eldar Zianbetov. Distributed clocking for synchronous SoCs. Micro and nanotechnologies/Microelectronics. Université Pierre et Marie Curie—Paris VI, 2013. English. (Year: 2013).*

George et al., "Harmonic Power Flow Determination Using The Fast Fourier Transform", IEEE Transactions on Power Delivery, IEEE, Apr. 1, 1991, vol. 6, No. 2, abstract, p. 530-535.

Allmeling, Institute of Electronic and Electronics Engineers: "A control structure for fast harmonic compensation in in active filters", Power Electronics Specialists Conference, Jun. 23, 2002, vol. 1, Chapter I, p. 376-381.

EPO Search Report and opinion in EP 15153694.3-1504 dated Jul. 30, 2015.

* cited by examiner

ELECTRICAL QUALITY MEASURING APPARATUS AND ELECTRICAL QUALITY MEASURING METHOD

This application is a division of U.S. application Ser. No. 15/000,091 filed on Jan. 19, 2016.

BACKGROUND

Technical Field

This The present description relates to an apparatus adapted to measure an electrical quantity. Particularly, said electrical quantity can be an electrical current, an electrical voltage or an electrical power associated with an electrical circuit included, as an example, in a distribution network.

Description of the Related Art

With particular reference to the measurement of the electrical power, the active power flowing in an electrical circuit is the product of current and voltage, according the well-known formula $P(t)=v(t)i(t)$. For AC circuits, power measurement needs to be carried out over one complete cycle, or possibly an integer number of cycles.

Digital power meters are known, which measure power by sampling current and voltage and then calculating the sample-by-sample product and averaging over a period (cycle), or an integer number of periods (cycles). The product between current and voltage in the above formula considers current and voltage values at the same instant of time.

Document EP-A-853364 describes a method for measuring a single electrical power load in an electrical distribution network. According to this document the phase angle between voltage and current is calculated by determining the instants of zero-crossing, respectively of the voltage and of the current.

The Applicant observes that the power measure described in EP-A-853364 can be affected by distortions in the measured current and voltage waveforms.

Document "Harmonic power flow determination using the Fast Fourier Transform"—T. A. George, D. Bones, IEE Transaction on Power Delivery Vol. 6, no. 2, April 1991— describes the use of Fast Fourier Transformation coefficients to calculate power flow associated with each single harmonic, in order to help locate its source.

SUMMARY

The Applicant has noticed that improvements in the reliability of the electrical quantity measurement together with a non-heavy computational technique could be desirable.

According to an embodiment, an electrical quantity measuring apparatus, comprising:
 a synchronization module structured to generate a synchronization signal;
 a first measurement apparatus connectable to an electrical circuit and structured to receive the synchronization signal and provide:
 first Fourier transform coefficients representing a first electrical quantity associated with said electrical circuit,
 a first delay value depending on a time offset between a measurement instant associated with the measure of the first electrical quantity and a reception instant of the synchronization signal at the first measurement apparatus;
 a processing module structured to process the first Fourier transform coefficients and the first delay value and provide first time-shifted Fourier transform coefficients representing a first synchronized measured electrical quantity.

Particularly, said first measurement apparatus is structured to provide the first Fourier transform coefficients as Discrete Fast Fourier Transform complex coefficients.

The present disclosure also provides an electrical quantity measuring method, comprising:
 connecting a measurement apparatus to an electrical circuit;
 transmitting a synchronization signal towards the measurement apparatus;
 receiving the synchronization signal at the measurement apparatus;
 measuring by the measurement apparatus an electrical quantity ($I(t)$) associated with said electrical circuit and providing corresponding Fourier transform coefficients,
 evaluating a delay value ($\Delta 1$) depending on a time offset between a measurement instant ($T_{sti}$) associated with the measure of the electrical quantity and a reception instant ($T_{rx}$) of the synchronization signal at the measurement apparatus;
 processing the Fourier transform coefficients and the delay value ($\Delta 1$) and providing time-shifted Fourier transform coefficients representing a first synchronized measured electrical quantity.

BRIEF DESCRIPTION OF THE DRAWINGS

Further characteristics and advantages will be more apparent from the following description of a preferred embodiment and of its alternatives given as a way of an example with reference to the enclosed drawings in which.

DETAILED DESCRIPTION OF AN EXAMPLE EMBODIMENT

Figure 1:
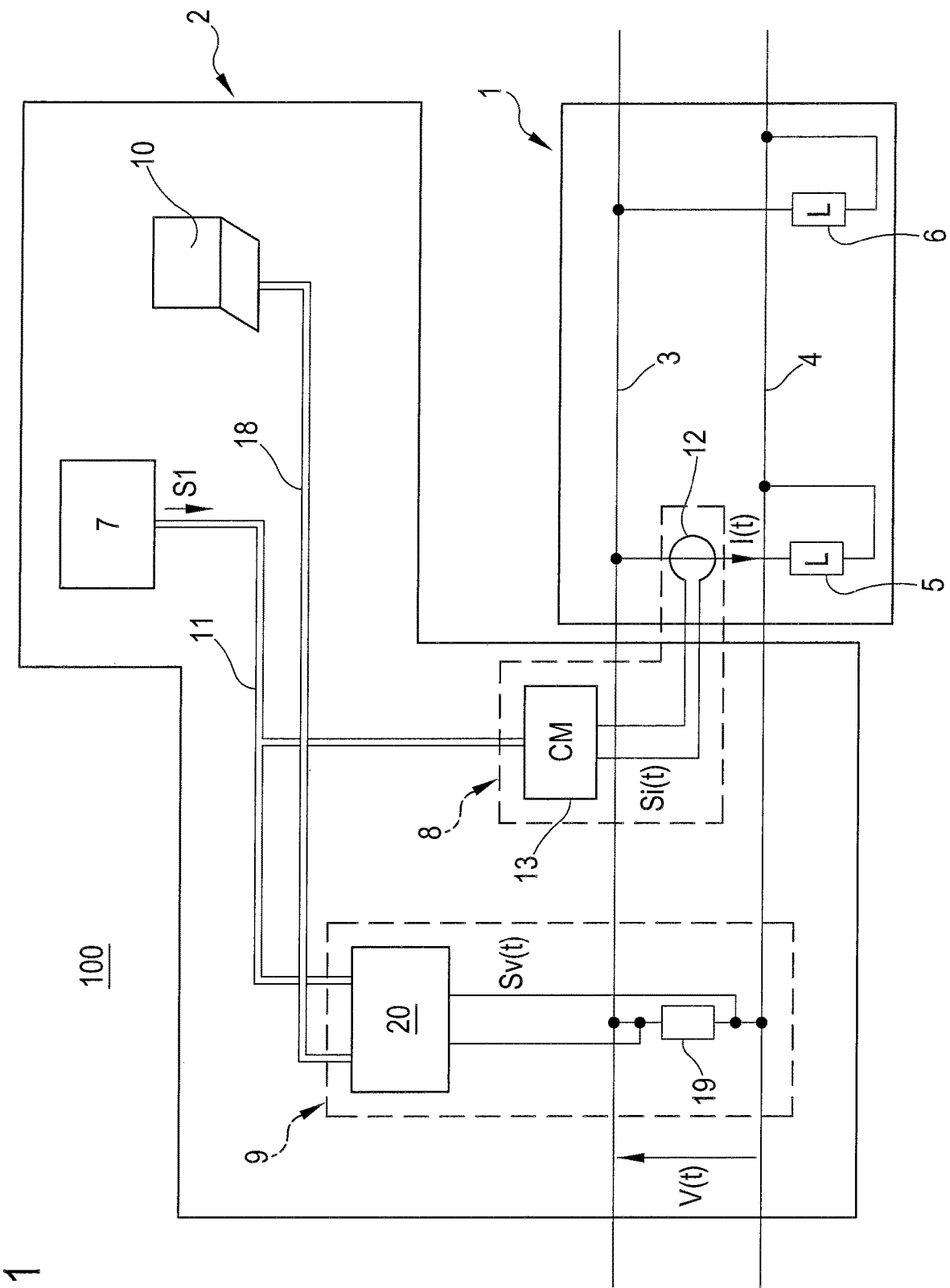
FIG. 1 shows an embodiment of an electrical system comprising an electrical circuit and an electrical quantity measurement apparatus.

FIG. 1 shows an embodiment of an electrical system 100 comprising an electrical circuit 1 and an electrical quantity measurement apparatus 2. As an example, the electrical circuit 1 is a portion of an electrical distribution network such as a high voltage, a medium voltage or, preferably, a low voltage network. According to an embodiment, the electrical circuit 1 is a single-phase circuit comprising a first line 3 and a second line 4. Particularly, the electrical circuit 1 can be a power distribution panel or similar switchgear and the first and second lines 3 and 4 are corresponding bus bars.

Particularly, the electrical circuit 1 shown in FIG. 1 can be connected to a first load 5 and at least a second load 6. The electrical circuit 1 can be provided by switches, circuit breakers, protection and control devices (not shown).

Alternatively to the example of FIG. 1, the electrical circuit 1 can be a two-phase circuit or a three-phase or in general an n-phase circuit with or without neutral line.

The electrical measurement apparatus 2 is configured to measure at least one electrical quantity associated with the electrical circuit 1, such as current, voltage and/or power. According to the described embodiment, the electrical measurement apparatus 2 is configured to measure the electrical power P(t) associated with one load of the electrical circuit 1 (as an example, the first load 5) by means of the measurement of electrical current I(t) flowing in the first load 5 and electrical voltage V(t) applied to the first load 5. The electrical measurement apparatus 2 can be also adapted to measure electrical power associated with the other loads of the electrical circuit 1.

In accordance with the embodiment shown in FIG. 1, the electrical quantity measurement apparatus 2 comprises a synchronization module 7, a current measurement apparatus 8, a voltage measurement apparatus 9 and a processing module 10.

The synchronization module 7 is structured to generate a synchronization signal S1 to be transmitted, according to a first example, over a synchronization channel 11 connected to the current measurement apparatus 8 and the voltage measurement apparatus 9.

In accordance with a first embodiment, the synchronization signal S1 has the aim of synchronizing the operation of the current measurement apparatus 8 and the voltage measurement apparatus 9 or the aim of providing a time reference for the current measurement apparatus 8 and the voltage measurement apparatus 9.

The synchronization module 7 can be a signal generator structured to transmit the synchronization signal S1 under the form of analog voltage pulses on a wired circuit. Alternatively, the synchronization module 7 can be a digital apparatus structured to transmit the synchronization signal S1 under the form of digital telegrams over a serial channel or an Ethernet line or other kind of communication channel.

In accordance with an example, the synchronization module 7 is configured to periodically transmit the synchronization signal S1 under the form of a pulse that is received by the current measurement apparatus 8 and the voltage measurement apparatus 9. The synchronization channel 11 is, as an example, a wired transmission line or can be a wireless link.

The current measurement apparatus 8 comprises a current sensor 12 connected to an electrical terminal of the first load 5 and a current measurement device 13 (CM). The current sensor 12 can be, as an example, a current transformer, a Rogowski coil, a hall-effect device.

The current measurement device 13 is a digital instrument configured to receive from the current sensor 12 a first sensed electrical signal Si(t) (such as a current or voltage signal) correlated to the current I(t) flowing into the first load 5.

Figure 2:
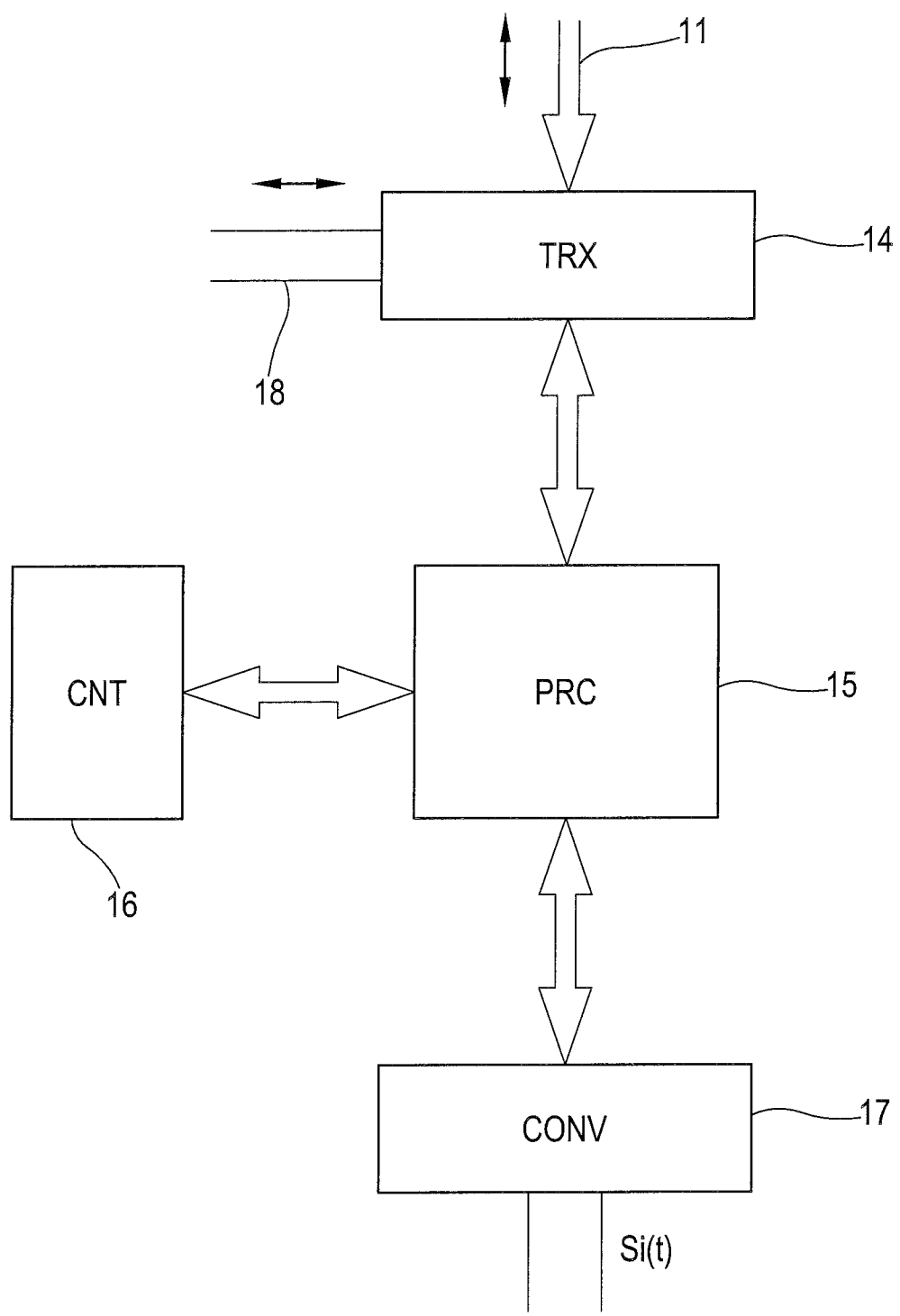
FIG. 2 shows schematically an example of an electrical current measurement device.

According to an embodiment shown in FIG. 2, the current measurement device 13 is provided with a first transceiver module 14 (TRX), a first processing module 15 (PRC), a first counter 16 (CNT) and a first conversion module 17 (CONV), which can be realized by one or more hardware and or software modules.

The first conversion module 17 is structured to process the first sensed electrical signal Si(t) to perform signal conditioning and analog-to-digital conversion. The analog-to-digital conversion of the first sensed electrical signal Si(t) comprises sampling, quantization, and coding steps performed to obtain a set of current digital values representing the current I(t) in the corresponding measurement time interval. As an example, the current digital values DI representing the current I(t) are obtained for a measurement time interval equal to one period of the current I(t) or an integer number of such periods.

Particularly, in operation, the conversion module 17 of the current measurement device 13 provides the following set of N samples (and corresponding digital values) of the current I(t):

$$I_n = I(T_{sti} + n \cdot \delta) \text{ with } n = 0 \ldots N-1 \qquad (1)$$

The N samples $I_n$ are taken, at a starting instant $T_{sti}$, with time interval between samples equal to $\delta t$. $T_{sti}$ can be assumed to be 0 without loss of generality.

The first processing module 15 is structured to compute the Fourier transform of the measured current I(t). Particularly, first processing module 15 is configured to receive the set of current digital values DI and compute the Discrete Fourier Transform by providing a plurality of Discrete Fourier Transform coefficients.

More particularly, the first processing module 15 is configured to compute from the samples $I_n$ received from the conversion module 17 the Discrete Fourier Transform in complex form by providing a plurality of Discrete Fourier Transform (DFT) complex coefficients, which can be stored in a memory of the first processing module 15. Preferably, the DFT calculation is performed by a Fast Fourier Transform (FFT) algorithm.

As an example, the complex FFT coefficients $I_k$ are calculated in complex form as:

$$I_k = \sum_{n=0}^{N-1} I_n e^{-i\frac{2\pi kn}{N}} \qquad (2)$$

The complex FFT coefficients can be expressed in real form as indicated below:

$$I_k = \sum_{n=0}^{N-1} I_n \left( \cos\frac{2\pi kn}{N} - i \cdot \sin\frac{2\pi kn}{N} \right) \qquad (3)$$

As indicated by expression (3) the calculation of the FFT is equivalent to the decomposition of the original signal into a finite set of sinusoids (each with a different amplitude, frequency and phase), the sum of which gives the original signal.

Moreover, it is possible to express the Fourier transform so that, for each frequency which is an integer multiple of the fundamental frequency of the signal, two sinusoids exist: one with zero phase at the start time instant of the measurement (i.e., at the time when the first signal sample is taken), and one with 90 degrees phase. These two sinusoids are referred to as "in phase" and "in quadrature" component for each frequency. The FFT provides as results the amplitudes of the two sinusoids. Such amplitudes are also referred to as "Real" and "Imaginary" components. This particular form of expressing the result of the FFT is known as FFT complex representation of FFT, or Complex FFT.

So, the "in phase" component $Re(I_k)$ and the "in quadrature" component $Im(I_k)$ can be expressed as indicated below:

$$Re(I_k) = \sum_{n=0}^{N-1} I_n \cos\frac{2\pi kn}{N} \qquad (4)$$

$$\text{Im}(I_k) = -\sum_{n=0}^{N-1} I_n \sin\frac{2\pi k n}{N} \quad (5)$$

It is observed that if the original signal I(t) or Si(t) is a pure sinusoid (as is the case of an AC signal without harmonics), only the real and imaginary components related to the fundamental frequency are non-zero. All the other results of the FFT are zero. The relationship between amplitudes of the real and imaginary components depends on the starting phase at the starting instant of the measurement ($T_{sti}$).

The first transceiver module 14 is configured to receive the synchronization signal S1 (via the synchronization channel 11) from the synchronization module 7 and to transmit digital values provided by the first processing module 15 towards the processing module 10.

The first processing module 15 is connected to the first counter 16 to compute a first delay value Δ1 representing a time offset between a measurement instant associated with the measure of the current I(t) and the reception instant of the synchronization signal S1 at the current measurement device 13. The first counter 16 is connected to a clock of the first processing module 15.

More particularly, the first delay value Δ1 can be a time delay between the reception instant $T_{rx}$ of the synchronization signal S1 at the current measurement device 13 and the subsequent start instant $T_{sti}$ of the measurement process performed by the current measurement device 13:

$$\Delta 1 = T_{sti} - T_{rx} \quad (6)$$

The start instant $T_{sti}$ can be the instant in which the first digital value of the sensed electrical signal Si(t) is sampled by the current measurement device 13 in a measuring interval having pre-established time length.

In accordance with another example, the first delay value Δ1 is a time delay between start instant $T_{sti}$ of the measurement process and the subsequent reception instant $T_{rx}$:

$$\Delta 1 = T_{rx} - T_{sti} \quad (7)$$

In accordance with a further example, the first delay value Δ1 is a time delay between the reception instant $T_{rx}$ of the synchronizing signal S1 and a subsequent end instant $T_{edi}$ of the measurement interval in the:

$$\Delta 1 = T_{edi} - T_{rx} \quad (8)$$

The end instant $T_{edi}$ can be the instant in which the last digital value of the sensed electrical signal Si(t) is sampled by the current measurement device 13 in the measuring interval.

Moreover, the first transceiver module 14 is connected to a data communication channel 18, such as a wired transmission link or a wireless link. The data communication channel 18 allows data exchanging between the current measurement device 13 and the processing module 10, such as the transmission of the plurality of current DFT complex coefficients and the first delay value Δ1. For example, it can be an Ethernet-type connection or a serial link.

According to another embodiment, the data communication channel 18 is employed to transmit also the synchronization signal S1 under the form of a signal suitable for the propagation on a said data communication channel. The synchronization signal S1 transmitted on the data communication channel 18 can be a digital packet which can be distinguished from the data transmission packets and, in this case, the synchronization channel 11 could be omitted.

In accordance with the example described, the voltage measurement apparatus 9 comprises a voltage sensor 19 and a voltage measurement device 20. The voltage sensor 19 is connected between the first line 3 and the second line 4 of the electrical circuit 1, so as to be in parallel electrical connection with the first load 5 and second load 6 and sense the electrical voltage V(t) between the first line 3 and the second line 4. The voltage sensor 19 can be, as an example, a capacitive sensor or a resistive sensor.

The voltage measurement device 20 is a digital instrument configured to receive from the voltage sensor 19 a second sensed electrical signal Sv(t) (such as a voltage signal) corresponding to the voltage V(t) applied between the first and second lines 3 and 4.

Figure 3:
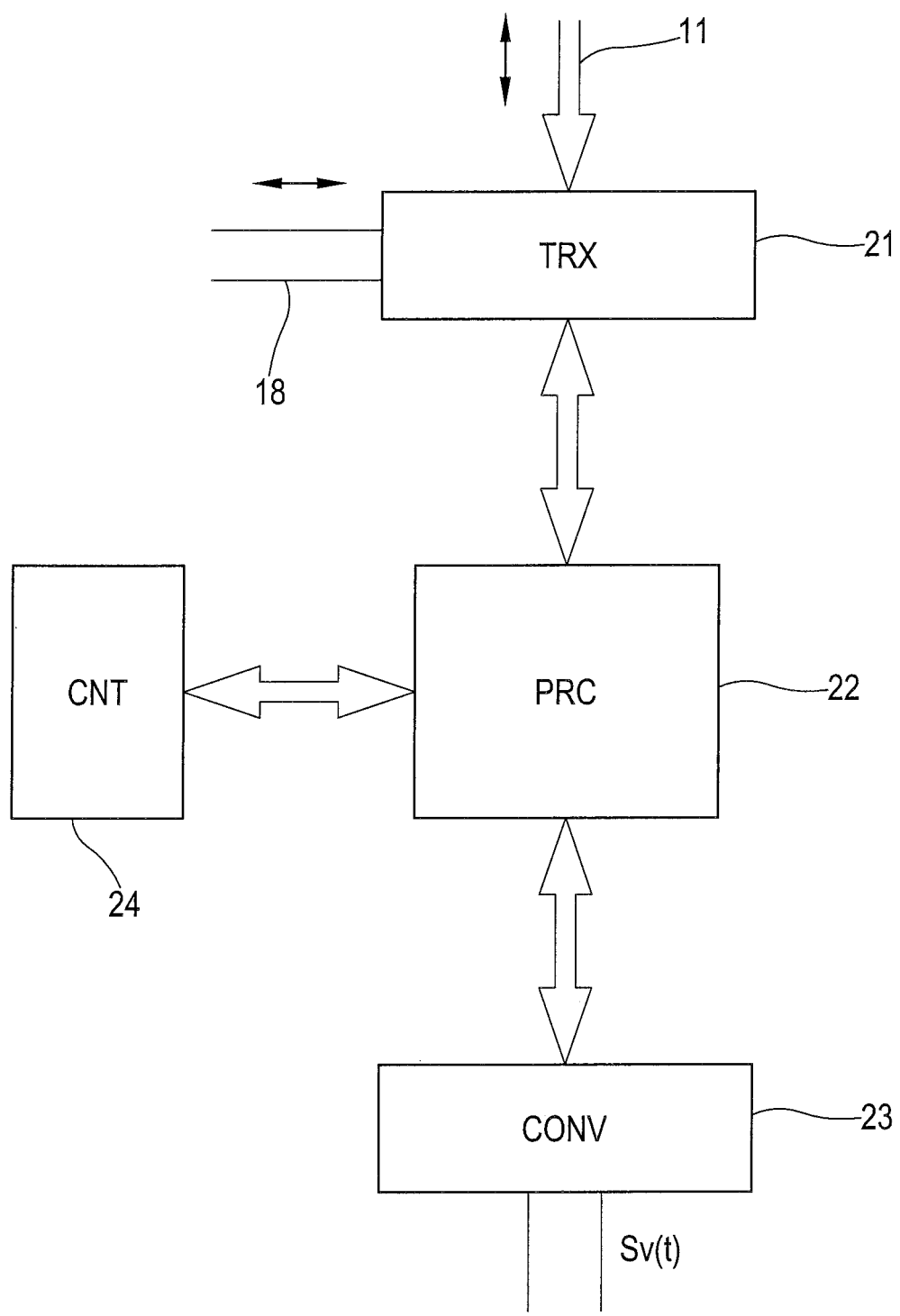
FIG. 3 shows schematically an example of an electrical voltage measurement device.

According to an example, shown in FIG. 3, the voltage measurement device 20 comprises a second transceiver module 21 (TRX), a second processing module 22 (PRC), second conversion module 23 (CONV) and, as an example, a second counter 24.

The second conversion module 23 (which can be analogous to the first conversion module 17) is structured to process the second sensed electrical signal Sv(t) to perform signal conditioning and analog-to-digital conversion. The analog-to-digital conversion of the first sensed electrical signal Sv(t) comprises sampling, quantization and coding steps performed to obtain a set of voltage digital values representing the voltage V(t) in the corresponding measurement time interval.

In accordance with the example made, the voltage digital values DV, representing the voltage V(t), are obtained with reference to a measurement time interval equal to one period of the AC voltage V(t) or an integer number of such periods.

Particularly, in operation, the second conversion module 23 provides the following set of N samples of the voltage V(t):

$$V_n = V(n \cdot \delta t) \text{ with } n=0 \ldots N-1 \quad (9)$$

The second processing module 22 is structured to compute the Fourier transform of the measured voltage V(t). Particularly, the second processing module 22 is configured to receive the set of voltage digital values and compute the Discrete Fourier Transform of said set of voltage digital values DV by providing a plurality of Discrete Fourier Transform coefficients. More particularly, the second processing module 22 is configured to compute the Discrete Fourier Transform in complex form, by providing a plurality of Discrete Fourier Transform (DFT) complex coefficients, which can be stored in a memory of the second processing module 22. Preferably, the DFT calculation is performed by Fast Fourier Transform (FFT) algorithm.

As an example, the voltage complex FFT coefficients $V_k$ are calculated in complex form as:

$$V_k = \sum_{n=0}^{N-1} I_n e^{-i\frac{2\pi k n}{N}} \quad (10)$$

The voltage complex FFT coefficients can be expressed in real form as indicated below:

$$V_k = \sum_{n=0}^{N-1} V_n \left( \cos\frac{2\pi k n}{N} - i \cdot \sin\frac{2\pi k n}{N} \right) \quad (11)$$

The "in phase" component $Re(V_k)$ and the "in quadrature" component $Im(V_k)$ can be expressed as indicated below:

$$Re(V_k) = \sum_{n=0}^{N-1} V_n \cos\frac{2\pi kn}{N} \quad (12)$$

$$Im(V_k) = -\sum_{n=0}^{N-1} V_n \sin\frac{2\pi kn}{N} \quad (13)$$

The second transceiver module 21 is configured to transmit the digital values provided by the second processing module 15 towards the processing module 10 by means of the data communication channel 18 or by another suitable channel.

In accordance with the embodiment shown in the figures, the second transceiver module 21 is configured to receive the synchronization signal S1 (via the synchronization channel 11) from the synchronization module 7 and to transmit digital values provided by the second processing module 22 towards the processing module 10.

The second processing module 22 is connected to the second counter 16 to compute a second delay value Δ2 representing a time offset between a measurement instant associated with the measure of the voltage V(t) and the reception instant of the synchronization signal S1 at the voltage measurement device 20. The second counter 16 is connected to a clock of the second processing module 22.

More particularly, the second delay value Δ2 can be a time delay between the reception instant $T_{rx}$ of the synchronization signal S1 at the voltage measurement device 20 and the subsequent_start instant $T_{stv}$ of the measurement process performed by the voltage measurement device 20:

$$\Delta 2 = T_{stv} - T_{rx} \quad (14)$$

The start instant $T_{stv}$ is defined in a manner analogous to the definition above provided of the start instant $T_{sti}$ of the current measurement. It is observed that for all practical purposes the propagation time of the synchronization signal S1 necessary to reach the voltage measurement device 20 is equal to the propagation time needed to reach the current measurement device 13, so that the signal reaches voltage measurement devices 20 and current measurement 13 at the same reception instant $T_{rx}$.

In accordance with another example, the second delay value Δ2 can be computed according to the following expression (15), which is analogous to the formula (7):

$$\Delta 2 = T_{rx} - T_{stv} \quad (15)$$

In accordance with a further example, the second delay value Δ2 is a time delay between the reception instant $T_{rx}$ of the synchronizing signal S1 and a subsequent end instant $T_{edv}$ of the voltage measurement interval as expressed in the following formula:

$$\Delta 2 = T_{edv} - T_{rx} \quad (16)$$

The end instant $T_{edv}$ can be defined in manner analogous to the definition of the end instant $T_{edi}$ above made with reference to the current measurement.

As described with reference to the current measurement device 20, the data communication channel 18 can be employed to transmit the synchronization signal S1 also to the second transceiver 21 of the voltage measurement device 20, instead of the synchronization channel 11.

It is observed that in accordance with another embodiment, the synchronization module 7 can be integrated in the voltage measurement apparatus 9 or in the current measurement apparatus 8. Preferably, the synchronization module 7 is integrated in the voltage current apparatus 9. In this case, the computation of the second time delay Δ2 can be omitted since the voltage measurement can be directly synchronized with the synchronization signal S1 which is a local signal.

With reference to FIG. 1, the processing module 10 is structured to process the plurality of current DFT complex coefficients and the first delay value Δ1, received from the current measurement apparatus 8, and generate a corresponding plurality of current time-shifted Fourier transform coefficients representing a synchronized measured current. Particularly, the plurality of current time-shifted Fourier transform coefficients are coefficients representing the measured current I(t) as if such current was measured in an measuring interval synchronized with the reception instant of the synchronization signal S1 at the current measurement apparatus 8.

As an example, the processing module 10 is configured to apply to the current Fourier transform coefficients $I_k$ of the expression (2) a shift processing according to the Circular Shift Theorem of Discrete Fourier Transform in order to obtain the current time-shifted Fourier transform coefficients $I'_k$:

$$I'_k = I_k e^{-i\frac{2\pi k \Delta 1}{N\delta t}} \quad (17)$$

The coefficients $I'_k$ represent the coefficients that would be obtained from samples of the same signal I(t) corresponding to a measurement process having a starting instant or an end instant at time $t=T_{rx}$, i.e. synchronized with the receiving instant of the synchronization signal S1.

The expression (17) shows a linear phase factor $-ik\omega$ applied to each coefficient $I_k$. The expression (17) can be re-written as:

$$I'_k = I_k e^{-ik\omega} \quad (18)$$

In which ω is an angular delay corresponding to the first delay Δ1 at the fundamental frequency:

$$\omega = 2\pi \frac{\Delta 1}{N\delta t} \quad (19)$$

In real terms, complex expression (13) translate into real terms to:

$$I'_k = I_k(\cos k\omega + i \sin k\omega) \quad (20)$$

So the in phase and in quadrature time-shifted DFT coefficients are:

$$Re(I'_k) = Re(I_k)\cos k\omega - Im(I_k)\sin k\omega \quad (21)$$

$$Im(I'_k) = Re(I_k)\sin k\omega + Im(I_k)\cos k\omega \quad (22)$$

In the case that the second delay value Δ2 is considered, the processing module 10 is structured to process the plurality of voltage DFT complex coefficients and the second delay value Δ2, received from the voltage measurement apparatus 9, and generate a plurality of voltage time-shifted Fourier transform coefficients representing a synchronized measured voltage.

Particularly, the plurality of voltage time-shifted Fourier transform coefficients are coefficients representing the measured voltage V(t) as said voltage is measured in an measuring interval synchronized with the reception instant of the synchronization signal S1 at the voltage measurement apparatus 9. The above mentioned Circular Shift Theorem of Discrete Fourier Transform can be applied to obtain the voltage time-shifted Fourier transform coefficients $V'_k$:

$$V'_k = V_k e^{-ik\omega} \quad (23)$$

In which $\omega$ is an angular delay corresponding to the second delay $\Delta 2$ at the fundamental frequency:

$$\omega = 2\pi \frac{\Delta 2}{N\delta t} \quad (24)$$

In real terms, complex expression (23) translate into real terms to:

$$V'_k = V_k(\cos k\omega + i \sin k\omega) \quad (25)$$

So the in phase and in quadrature time-shifted FFT coefficients are:

$$\mathrm{Re}(V'_k) = \mathrm{Re}(V_k)\cos k\omega - \mathrm{Im}(V_k)\sin k\omega \quad (26)$$

$$\mathrm{Im}(V'_k) = \mathrm{Re}(V_k)\sin k\omega + \mathrm{Im}(V_k)\cos k\omega \quad (27)$$

The processing module 10 is structured to calculate the active power P(t) flowing in the first load 5. Active power flowing in an electrical circuit is the product of current and voltage, as in the formula P(t)=V(t)*I(t). For AC circuits, power measurement is carried out over one complete cycle, or possibly an integer number of cycles.

Particularly, the processing module 10 is configured to perform a sample by sample product of two signals representing the electrical quantities I(t) and V(t) by employing the corresponding time-shifted DFT coefficients according to the Plancherel's theorem:

$$\sum_{n=0}^{N-1} V_n I_n^* = \frac{1}{N} \sum_{k=0}^{N-1} V'_k {I'_k}^* \quad (28)$$

By employing expressions (21), (22), (26) and (27) the expression (28) the expression simplifies to:

$$\sum_{n=0}^{N-1} V_n I_n = \frac{1}{N} \sum_{k=0}^{N-1} V'_k {I'_k}^* = \frac{1}{N} \sum_{k=0}^{N-1} [\mathrm{Re}(V'_k)\mathrm{Re}(I'_k) + \mathrm{Im}(V'_k)\mathrm{Im}(I'_k)] \quad (29)$$

If the second delay value $\Delta 2$ is not computed, the processing module 10 evaluates expression (29) using coefficients of formulas (12) and (13) with reference to the DFT coefficients of the voltage V(t), instead of formulas (26) and (27).

Figure 4:
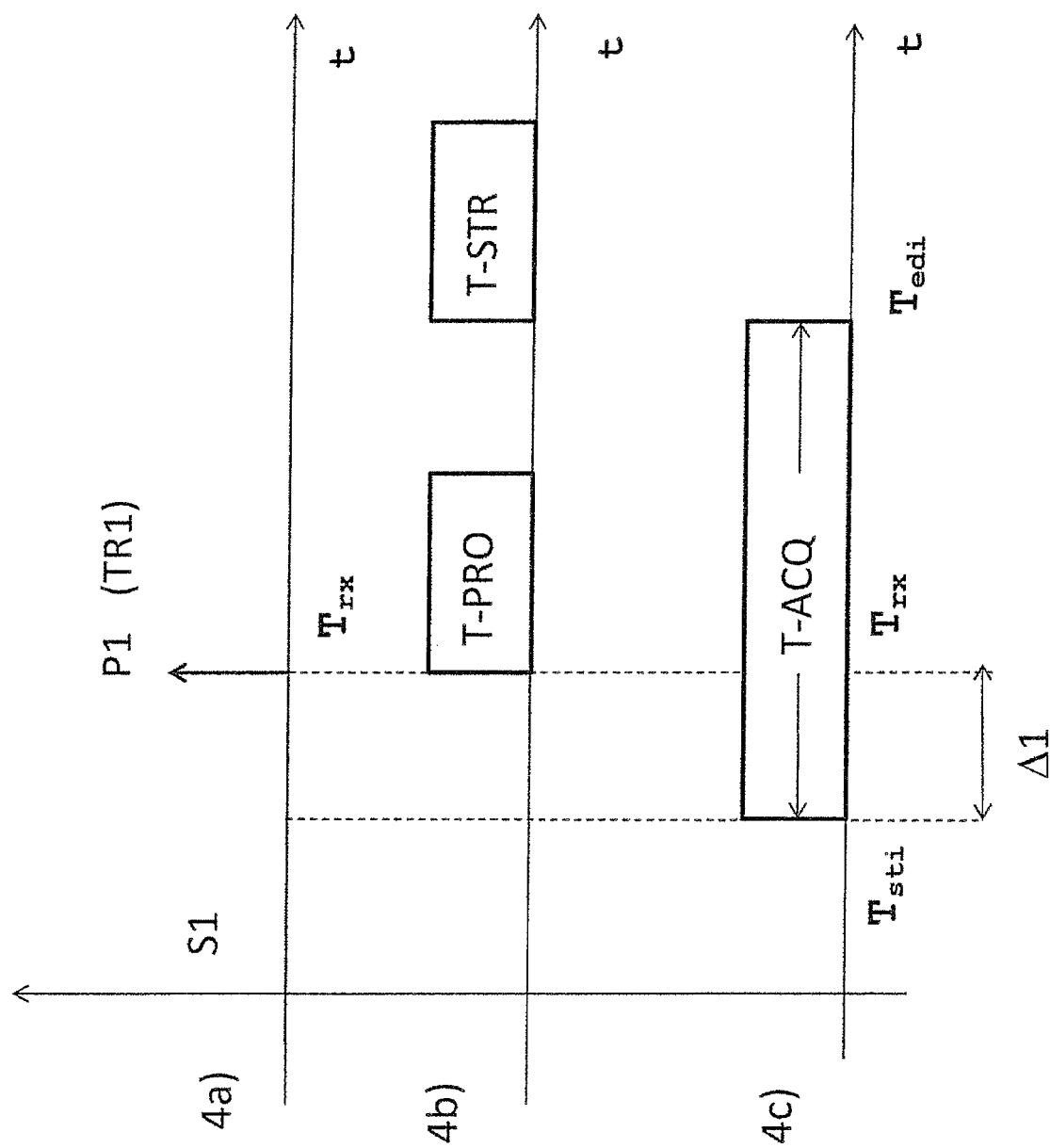
FIG. 4 illustrates three diagrams referring to the operation of the electrical quantity measurement apparatus, in accordance with a first example.
Figure 5:
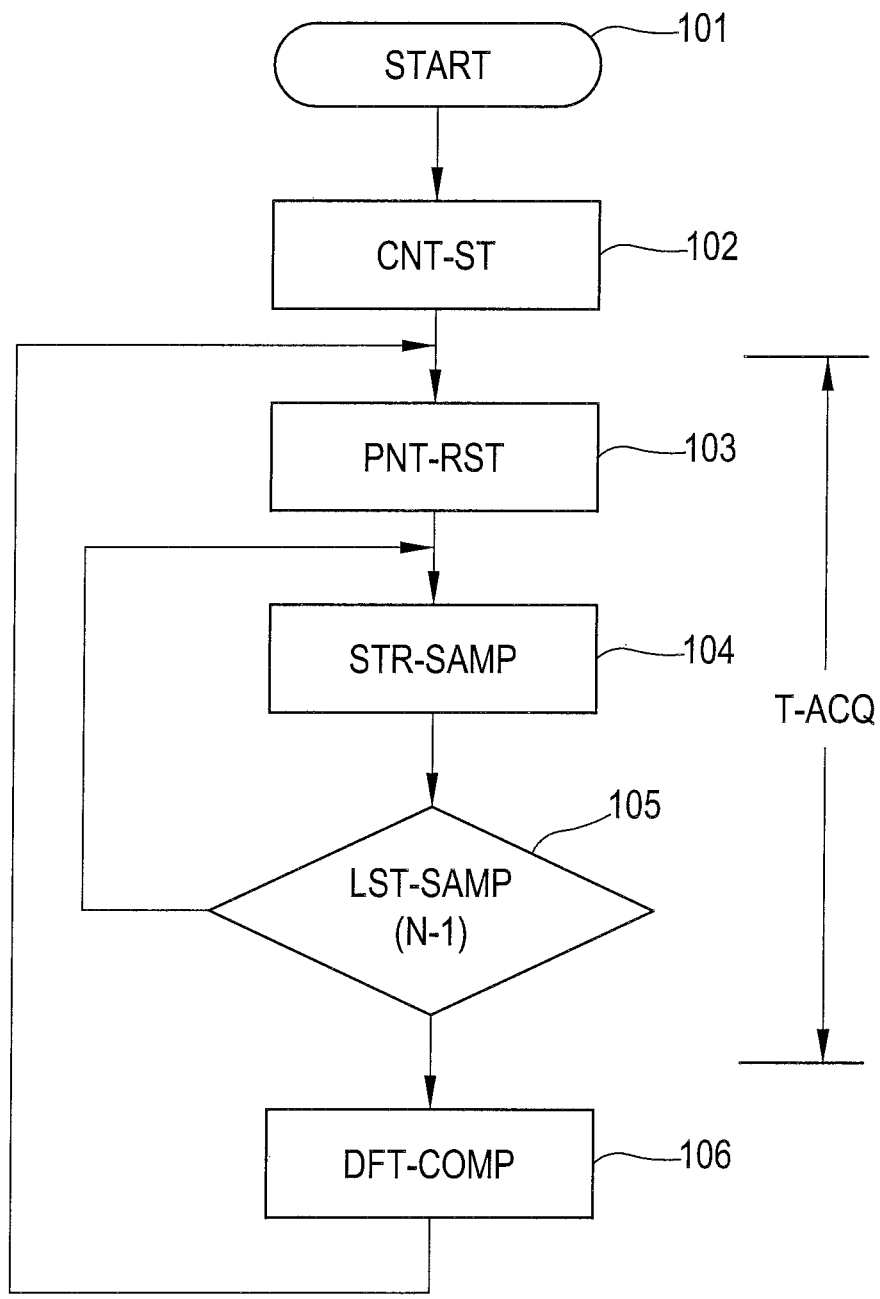
FIG. 5 shows by means of a flow chart an example of operation of the electrical quantity measurement apparatus.

A first example of operation method will be now described with reference to FIGS. 4 and 5. According to this first example, the synchronization signal S1 has the function of providing a time reference for the measurement and acquisition processing performed by the current measurement apparatus 8 and/or the voltage measurement apparatus 9. In the following description reference is made to the current measurement apparatus FIG. 4 shows three diagrams in which diagram 4*a*) refers to the synchronization signal S1, diagram 4*b*) refers to processing at the current measurement apparatus 8, diagram 4*c*) refers to the sample acquisition step at the current measurement apparatus 8, with time offset according to equation (7). FIG. 5 shows a flowchart 200 illustrating some of the operation steps of the current measurement apparatus 8.

After a symbolic start step 101, the first counter 16 is reset and is activated to perform a counting step 102 (CNT-ST): pointers are reset and data sampling and acquisition starts at the starting instant $T_{sti}$.

At the start instant $T_{sti}$ the current measurement apparatus 8 acquires a first digital value corresponding to a first sample of current I(t), and the acquisitions of the other samples (as defined by formula (1)) proceed further in an acquisition interval T-ACQ (FIG. 4*c*). Moreover, the first processing module 15 stores the first acquired digital sample in a storing step 104 (STR-SAMP), as shown in FIG. 5, and acquires subsequent samples until the last sample N−1 is acquired, as identified by means of an IF step 105 (LST-SAMP).

If during acquisition time a synchronization signal S1 is received (e.g, pulse P1 or a telegram TR1), at the reception instant $T_{rx}$, a current value of the first counter 16 of the current measurement device 13 is stored. This provides a measurement of offset $\Delta 1$ according to formula (7).

During time interval T-PRO (FIG. 4*b*) the synchronization signal S1 is processed to check for absence of errors. In case in that the data communication channel 18 is used also for synchronization purposes, this processing is also used to check if the telegram TR1 associated with synchronization signal S1 is of synchronization type.

As indicated in FIG. 4*b*), the first processing module 15 stores, in a processing interval T-STR, the first delay value $\Delta 1$ obtained by the first counter 16. The storing of the first delay value $\Delta 1$, preferably, occurs at the end of the acquisition of the N−1 samples.

The computation of the first delay value $\Delta 1$ can be alternatively made with reference to the end instant $T_{edi}$ according to expression (8).

Moreover, in a DFT computation step 106 (DFT-COMP) the first processing module 15 performs the computations of the complex DFT coefficients as defined by above expressions (4) and (5), (preferably, by means of FFT algorithms). The complex DFT coefficients and the first delay value $\Delta 1$ computed by the current measurement apparatus 8 are provided to the processing module 10 (shown in FIG. 1).

The voltage measurement apparatus 9 operates in a manner analogous to the current measurement apparatus 8 and provides the processing module 10 with the complex DFT coefficients according to expressions (12) and (13) with second delay value $\Delta 2$, if it has been considered.

The processing module 10 performs the time shift computation according to above mentioned expressions (21) and (22) so obtaining the in phase and in quadrature time-shifted DFT coefficients with reference to the current I(t):

$$\mathrm{Re}(I'k) = \mathrm{Re}(I_k)\cos k\omega - \mathrm{Im}(I_k)\sin k\omega \quad (21)$$

$$\mathrm{Im}(I'k) = \mathrm{Re}(I_k)\sin k\omega + \mathrm{Im}(I_k)\cos k\omega \quad (22)$$

With reference to the electrical voltage V(t), if the second delay value $\Delta 2$ is computed, the processing module 10 performs the time shift computation according to above mentioned expressions (26) and (27) so obtaining the in phase and in quadrature time-shifted DFT coefficients:

$$\mathrm{Re}(V'_k) = \mathrm{Re}(V_k)\cos k\omega - \mathrm{Im}(V_k)\sin k\omega \quad (26)$$

$$\mathrm{Im}(V'_k) = \mathrm{Re}(V_k)\sin k\omega + \mathrm{Im}(V_k)\cos k\omega \quad (27)$$

Moreover, the processing module 10 computes the active power P(t) by means of the complex DFT coefficients expressed above and according to the already mentioned expressions (29):

$$\sum_{n=0}^{N-1} V_n I_n = \frac{1}{N} \sum_{k=0}^{N-1} V'_k I'^*_k = \frac{1}{N} \sum_{k=0}^{N-1} [\text{Re}(V'_k)\text{Re}(I'_k) + \text{Im}(V'_k)\text{Im}(I'_k)] \quad (29)$$

It is observed that, once the DFT coefficients of current I(t) and voltage V(t) are known, in addition or alternatively to the active power several other electrical quantities can be calculated based on the DFT coefficients, such as: Root Mean Square (RMS) value of current and voltage, apparent power, reactive power (according to several available methods/definitions).

The above described method can be also applied to three-phase and multi-phase systems by employing the same calculation procedures. As an example, power in a busbar system having several three-phase parallel circuits can be measured using only one three-phase voltage measurement instruments instead of one per circuit.

The above described electrical quantity measurement apparatus 2 and the corresponding measuring method provide several advantages. The described measurement of the electrical quantity is particularly reliable since it does not employ the shape of the electrical quantity waveform to mark a time reference, contrary to the techniques employing zero-crossing detection which can be affected by wave distortion.

Another advantages is due to the fact that electrical quantity measurement apparatus 2 can operate independently from the presence of harmonics in the electrical quantity to be measured, which do not compromise the quality of the results.

It is observed that, since typically in an electrical system there is a limited number of harmonics, most Fourier coefficients are zero. The electrical quantity measurement apparatus 2 can operate by transmitting only the nonzero sampled values. As an additional advantage, bandwidth requirements are reduced with respect to the need of transmitting the full set of samples over the communication channel.

In addition, the computed Fourier coefficients are available for further processing, such as an example, the computation of active power, reactive power, apparent power Moreover, the use of a synchronization signal generated by a synchronization module and sent to the measurement apparatus ensures that no software-related delays, and consequent errors, are introduced; so the problems occurring on microprocessor systems, where software execution times are not predictable because they can be modified unexpectedly by hardware interrupts or operating system scheduling policy, are overcome.

The invention claimed is:

1. Electrical quantity measuring system associated with a synchronization signal (S1), the system comprising:
   an electrical circuit of an electrical distribution network, the electrical circuit including a switchgear having first and second loads; and
   an electrical quantity measuring apparatus comprising:
      a first measurement apparatus connected to at least one of the first and second loads, said first measurement apparatus being structured to receive the synchronization signal (S1) and to provide:
      first Fourier transform coefficients representing a first electrical quantity (I(t)) associated with said electrical circuit,
      a first delay value ($\Delta 1$) representing a time offset between a measurement instant ($T_{sti}$) associated with the measure of the first electrical quantity and a reception instant ($T_{rx}$) of the synchronization signal (S1) at the first measurement apparatus; and
      a processing module structured to process the first Fourier transform coefficients and the first delay value received from said first measuring apparatus and to provide first time-shifted Fourier transform coefficients representing a first synchronized measured electrical quantity,
   wherein said measurement apparatus is provided with:
   a transceiver module constructed and arranged to receive said synchronization signal (S1);
   a counter module constructed and arranged to compute the first delay value ($\Delta 1$),
   a conversion module constructed and arranged to provide a plurality of digital values representing said first electrical quantity (I(t)) in a measuring interval;
   wherein said measurement instant ($T_{sti}$) is a start instant in which an initial digital value of the plurality of digital values has been sampled,
   wherein the first measurement apparatus includes a voltage sensor in parallel electrical connection with the first and second loads.

2. The system according to claim 1, wherein said first measurement apparatus is structured to provide the first Fourier transform coefficients as Discrete Fast Fourier Transform complex coefficients.

3. The system according to claim 2, wherein the processing module is structured to apply to the first Fourier transform coefficients a shift processing according to Circular Shift Theorem of Discrete Fourier Transform to obtain first time-shifted Fourier transform coefficients.

4. The system of claim 3, wherein said first measurement apparatus is one of the following apparatuses: electrical current measurement apparatus, electrical voltage measurement apparatus.

5. The system according to claim 4, further comprising a second measurement apparatus connected to the electrical circuit and belonging to the following group: electrical current measurement apparatus, electrical voltage measurement apparatus; wherein said second measurement apparatus is configured to receive said synchronization signal (S1) and provide second Fourier transform coefficients representing a second electrical quantity (V(t)) associated with said electrical circuit.

6. The system according to claim 5, wherein:
   the second measurement apparatus is configured to generate a second delay value representing a further time offset between a further measurement instant associated with the measure of the second electrical quantity (V(t)) and the reception instant of the synchronization signal (S1) at the second measurement apparatus; and wherein
   the processing module is structured to process the second Fourier transform coefficients and the second delay value received from said second measurement apparatus and to provide second time-shifted Fourier transform coefficients representing a second synchronized measured electrical quantity.

7. The system according to claim 6, wherein said processing module is configured to process the first time-shifted Fourier transform coefficients and the second Fourier transform coefficients or the second time-shifted Fourier transform coefficients to obtain a corresponding measured electrical power.

8. The system according to claim 7, wherein the processing module is configured process the first time-shifted Fourier transform coefficients and the second Fourier transform coefficients or the second time-shifted Fourier transform coefficients to obtain one of the following quantities: Root Mean Square (RMS) value of current and voltage, apparent electrical power, reactive electrical power.

9. The system according to claim 1, wherein said measurement instant is an end instant in which a final digital value of the plurality of digital values has been sampled.

10. The system according to claim 1, wherein said transceiver module is connected to the processing module by a data channel.

11. The system according to claim 10, wherein said data channel is constructed and arranged to transmit the synchronization signal (S1).

12. The system according to claim 1, further comprising first and second loads connected with the electrical circuit, wherein the electrical circuit is a switchgear having first and second bus bars, the first bus bar being coupled to the first load and the second bus bar being coupled to the second load.

13. The system according to claim 1, wherein the first measurement apparatus includes a current sensor electrically connected to the first load.

* * * * *